(12) United States Patent
Wang et al.

(10) Patent No.: US 11,169,228 B2
(45) Date of Patent: Nov. 9, 2021

(54) MAGNETIC SENSOR WITH SERIAL RESISTOR FOR ASYMMETRIC SENSING FIELD RANGE

(71) Applicant: Western Digital Technologies, Inc., San Jose, CA (US)

(72) Inventors: Yung-Hung Wang, San Jose, CA (US);
Daniele Mauri, San Jose, CA (US);
Ming Mao, Dublin, CA (US);
Chen-jung Chien, Mountain View, CA (US); Yuankai Zheng, Fremont, CA (US); Chih-Ching Hu, Pleasanton, CA (US); Carlos Corona, Pleasanton, CA (US); Matthew Stevenson, San Jose, CA (US); Ming Jiang, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 80 days.

(21) Appl. No.: 16/730,784

(22) Filed: Dec. 30, 2019

(65) Prior Publication Data
US 2021/0063509 A1    Mar. 4, 2021

Related U.S. Application Data

(60) Provisional application No. 62/892,240, filed on Aug. 27, 2019.

(51) Int. Cl.
*G01R 33/09* (2006.01)
*G11B 5/39* (2006.01)
(Continued)

(52) U.S. Cl.
CPC ......... *G01R 33/098* (2013.01); *G01R 17/105* (2013.01); *G01R 33/09* (2013.01);
(Continued)

(58) Field of Classification Search
None
See application file for complete search history.

(56) References Cited

U.S. PATENT DOCUMENTS

| 7,126,327 B1 | 10/2006 | Busch |
| 7,710,113 B2 | 5/2010 | Crolly et al. |
| (Continued) | | |

FOREIGN PATENT DOCUMENTS

| JP | 4316806 B2 | 8/2009 |
| JP | 6220971 B2 | 10/2017 |
| (Continued) | | |

OTHER PUBLICATIONS

Zhang, Wenzhe et al.; "Low-Frequency Noise in Serial Arrays of MgO-Based Magnetic Tunnel Junctions"; American Physical Society, Physical Review B 84, 094446; 2011 (7 pages).
(Continued)

*Primary Examiner* — Jefferson A Evans
(74) *Attorney, Agent, or Firm* — Patterson & Sheridan, LLP; Steven H. Versteeg

(57) ABSTRACT

The present disclosure generally relates to a Wheatstone bridge that has four resistors. Each resistor includes a plurality of tunneling magnetoresistance (TMR) structures. Two resistors have identical TMR structures. The remaining two resistors also have identical TMR structures, though the TMR structures are different from the other two resistors. Additionally, the two resistors that have identical TMR structures each have an additional non-TMR resistor as compared to the remaining two resistors that have identical TMR structures. Therefore, the working bias field for the Wheatstone bridge is non-zero.

20 Claims, 6 Drawing Sheets

(51) Int. Cl.
  *H01L 43/08* (2006.01)
  *G01R 17/10* (2006.01)
  *G11B 5/29* (2006.01)

(52) U.S. Cl.
  CPC ............ *G11B 5/295* (2013.01); *G11B 5/3909* (2013.01); *G11B 5/3948* (2013.01); *H01L 43/08* (2013.01); *G11B 5/39* (2013.01)

(56) References Cited

U.S. PATENT DOCUMENTS

| | | | |
|---|---|---|---|
| 8,922,205 B2 | 12/2014 | Liu et al. | |
| 9,591,221 B2 | 3/2017 | Miller et al. | |
| 9,684,184 B2 | 6/2017 | Miller et al. | |
| 10,288,700 B2 | 5/2019 | Bai | |
| 10,557,725 B2* | 2/2020 | Paul | G01D 5/16 |
| 2006/0127701 A1 | 6/2006 | Ruigrok et al. | |
| 2013/0300409 A1* | 11/2013 | Deak | G01R 33/098 |
| | | | 324/252 |
| 2015/0309128 A1* | 10/2015 | Raberg | G01R 33/0041 |
| | | | 324/252 |
| 2016/0238635 A1* | 8/2016 | Zimmer | G01R 33/0017 |
| 2016/0291097 A1* | 10/2016 | Kuo | G01R 33/098 |
| 2017/0322052 A1* | 11/2017 | Paul | G01D 5/16 |
| 2018/0164387 A1* | 6/2018 | Raberg | G01R 33/098 |
| 2018/0254686 A1 | 9/2018 | Komasaki et al. | |
| 2019/0018083 A1* | 1/2019 | Fujiwara | G01R 33/10 |
| 2019/0020822 A1 | 1/2019 | Sharma et al. | |
| 2020/0271734 A1* | 8/2020 | Raberg | G01R 33/0041 |

FOREIGN PATENT DOCUMENTS

| | | |
|---|---|---|
| JP | 2018-146280 A | 9/2018 |
| KR | 101817846 B1 | 1/2018 |

OTHER PUBLICATIONS

Ferreira, Ricardo et al.; "2-Axis Magnetometers Based on Full Wheatsone Bridges Incorporating Magnetic Tunnel Junctions Connected in Seriers"; IEEE Transactions on Magnetics, vol. 48, No. 11, Nov. 2012 (4 pages).

International Search Report and Written Opinion issued in corresponding International Patent Application No. PCT/US2020/023993, dated Oct. 19, 2020 (10 pages).

* cited by examiner

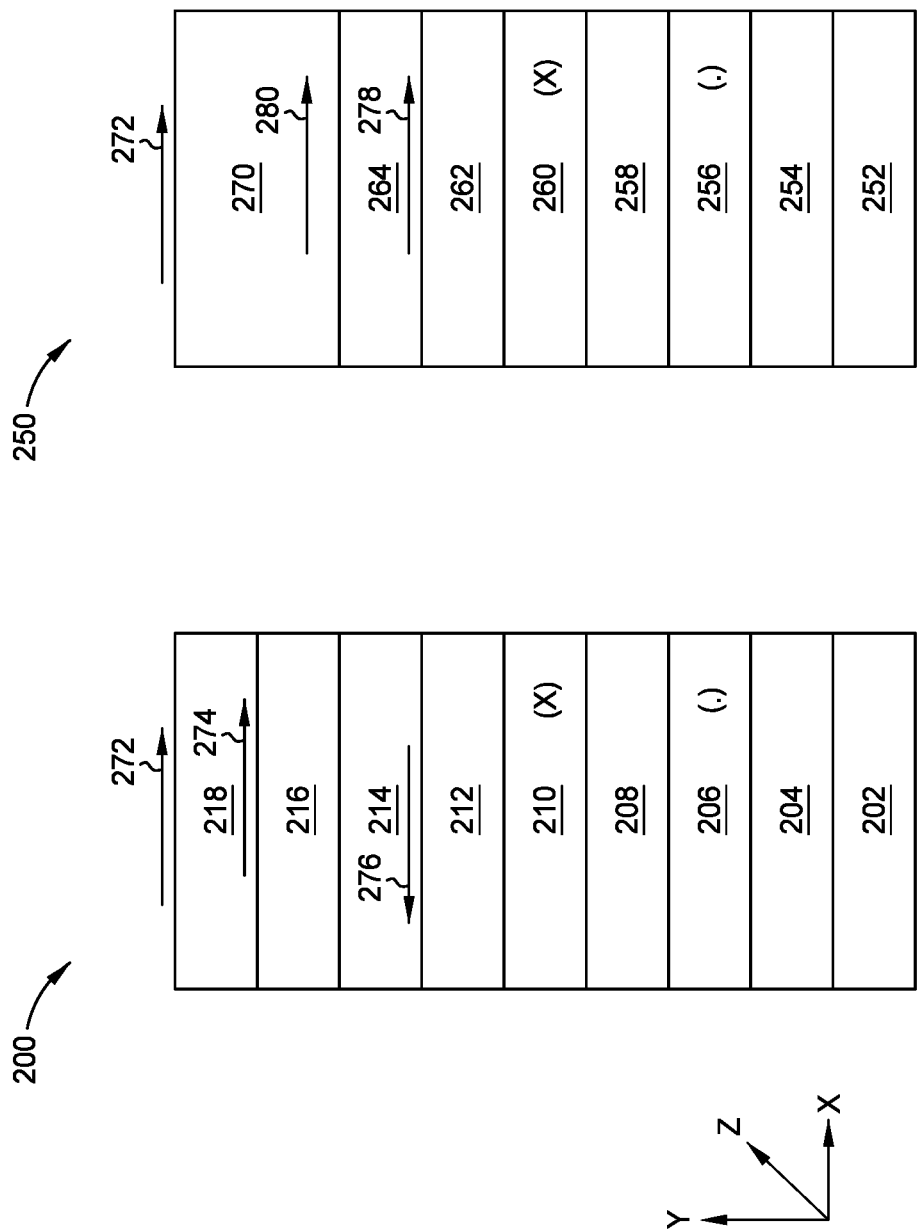

MAGNETIC SENSOR WITH SERIAL RESISTOR FOR ASYMMETRIC SENSING FIELD RANGE

CROSS-REFERENCE TO RELATED APPLICATIONS

This application claims benefit of U.S. Provisional Patent Application Ser. No. 62/892,240, filed Aug. 27, 2019, which is herein incorporated by reference.

BACKGROUND OF THE DISCLOSURE

Field of the Disclosure

Embodiments of the present disclosure generally relate to a Wheatstone bridge and a method of manufacture thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as magnetic sensors. Magnetic sensors can include Hall effect magnetic sensors, anisotropy magnetoresistive sensors (AMR), giant magnetoresistive (GMR) sensors, and tunnel magnetoresistive (TMR) sensors. The TMR sensor has a very high sensitivity compared to other magnetic sensors.

While a zero bias field is generally desired for the initial state of the Wheatstone bridge, some applications require a non-zero initial state. For position sensor applications, a magnet is used to generate the field. The TMR resistors in the Wheatstone bridge detect the magnetic field from the magnet. Initially there is a field acting on the sensor, and the field strength is increased or decreased when the magnet is moving closer or away from the sensor.

Therefore, there is a need in the art for a Wheatstone bridge magnetic sensor that is operating under a bias field.

SUMMARY OF THE DISCLOSURE

The present disclosure generally relates to a Wheatstone bridge that has four resistors. Each resistor includes a plurality of TMR structures. Two resistors have identical TMR structures. The remaining two resistors also have identical TMR structures, though the TMR structures are different from the other two resistors. Additionally, the two resistors that have identical TMR structures each have an additional non-TMR resistor as compared to the remaining two resistors that have identical TMR structures. Therefore, the working bias field for the Wheatstone bridge is non-zero.

In one embodiment, a TMR sensor device comprises: a first resistor comprising a first plurality of TMR structures; a second resistor comprising a second plurality of TMR structures; a third resistor comprising a third plurality of TMR structures; a fourth resistor comprising a fourth plurality of TMR structures; a fifth resistor connected in series to the second resistor, wherein the fifth resistor is a non-TMR resistor; and a sixth resistor connected in series to the fourth TMR resistor, wherein the sixth resistor is a non-TMR resistor.

In another embodiment, a TMR sensor device comprises: a plurality of resistors that each contain a plurality of TMR structures, wherein at least two resistors of the plurality of resistors contain different TMR structures, wherein at least two resistors of the plurality of resistors contain identical TMR structures, and wherein at least two resistors are non-TMR resistors.

In another embodiment, a method of manufacturing a TMR sensor device comprises: forming a first resistor having a first plurality of TMR structures; forming a second resistor having a second plurality of TMR structures; forming a third resistor having a third plurality of TMR structures; forming a fourth resistor having a fourth plurality of TMR structures; forming a fifth resistor that has no TMR structures, wherein the fifth resistor is connected in series to the second resistor; and forming a sixth resistor that has no TMR structures, wherein the sixth resistor is connected in series to the fourth resistor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A and 2B are schematic illustrations of TMR structures according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a Wheatstone bridge that has four resistors. Each resistor includes a plurality of TMR structures. Two resistors have identical TMR structures. The remaining two resistors also have identical TMR structures, though the TMR structures are different from the other two resistors. Additionally, the two resistors that have identical TMR structures each have an additional non-TMR resistor as compared to the remaining two resistors that have identical TMR structures. Therefore, the working bias field for the Wheatstone bridge is non-zero.

Figure 1:
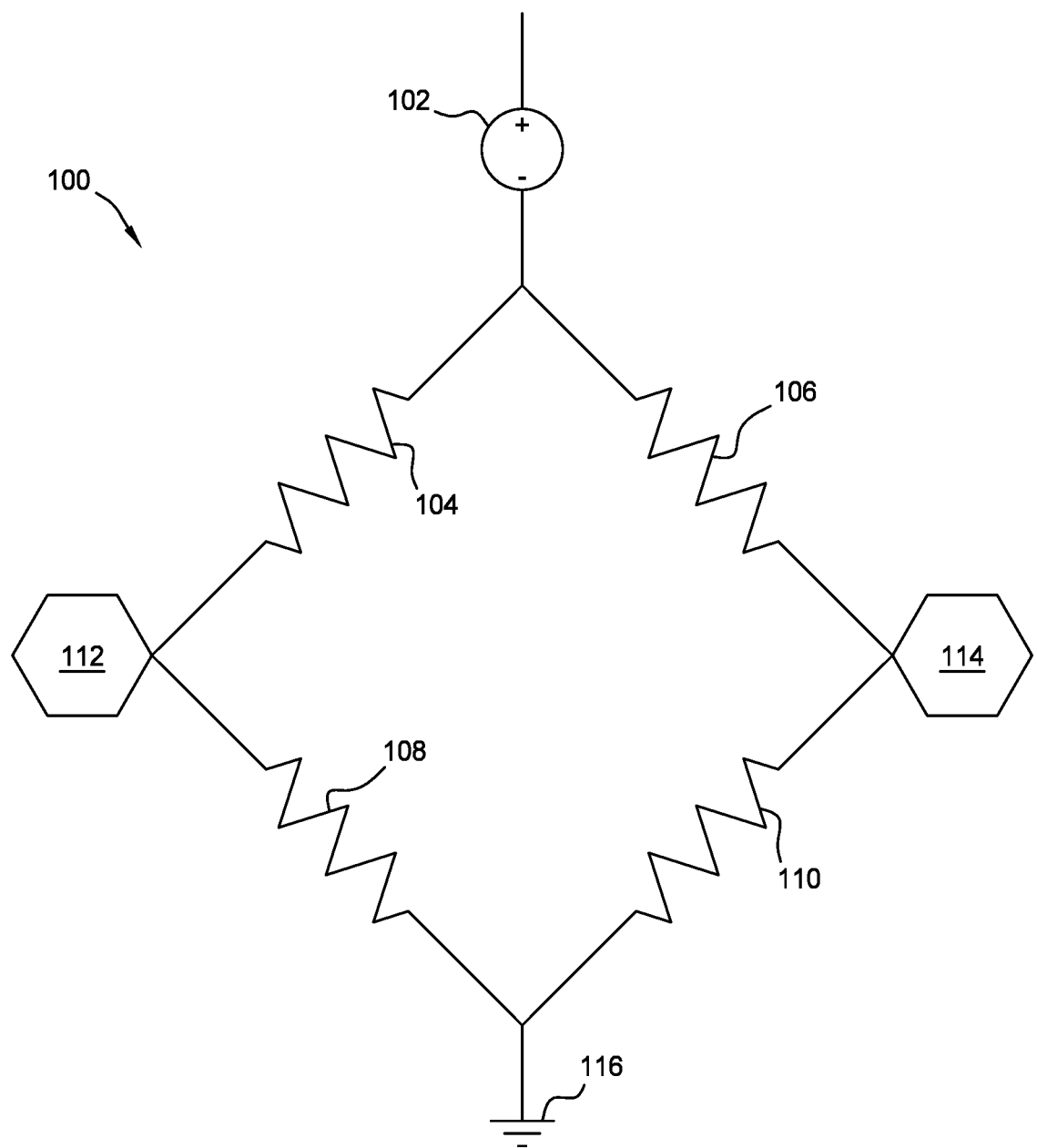
FIG. 1 is a schematic illustration of a Wheatstone bridge design.

FIG. 1 is a schematic illustration of a Wheatstone bridge 100 design. The bridge 100 includes a bias source 102, a first resistor 104, a second resistor 106, a third resistor 110, a fourth resistor 108, a first output pad 112, a second output pad 114, and a ground connection 116. Bias voltage is applied across the bridge from the bias source 102 to the ground connection 116. The bridge output is the potential difference across the first output pad 112 and the second output pad 114. Any change in resistance due to temperature variation from the resistors 104, 106, 108, 110 is nullified due to the nature of differential output.

As discussed herein, the resistors 104, 106, 108, 110 each is made of a TMR film. In one embodiment, the TMR resistors are each distinct and different such that the resistors 104, 106, 108, 110 have different resistance. In another embodiment, the TMR films are identical, but the resistors 104, 106, 108, 110 are different. In still another embodiment, resistors 104, 110 are identical to each other (as are the TMR films that the resistors 104, 110 are made of), and resistors 106, 108 are identical to each other (as are the TMR films that the resistors 106, 108 are made of) yet different from resistors 104, 110.

Typical magnetic field sensors use TMR resistors in a Wheatstone bridge circuit. The TMR resistors have to have different responses to the magnetic field in order to generate the differential output voltage. As discussed herein, a new method to make a magnetic field sensor is to fabricate two different TMR films in the same layer. The reliability and performance of the TMR films determines the magnetoresistance response. In this way, combined with different TMR films features, a perfect Wheatstone bridge design for magnetic field sensor can be fabricated.

In regards to FIG. 1, if the free layer of the TMR films that the resistors 104, 106, 108, 110 are made of has a long axis of +45° or −45° to the pinned layer magnetization direction, then the free layer easy axis is restricted to be along the long axis due to the shape anisotropy, and the magnetization direction can be set bidirectional along the long axis by an ampere field from the set line which is sitting on top of the free layer and orthogonal to the free layer long axis.

When applying a magnetic field along the Y-axis, the resistances of 110 and 104 are increasing while the resistances of 106, 108 are decreasing with the field. This different response enables the Wheatstone bridge, and the sensor sensitivity is proportional to the output voltage which is proportional to the resistance difference between resistor 110 (or resistor 104) and resistor 106 (or resistor 108). However, only half of the magnetoresistance change is used due to the 45° free layer or pinned layer initial state. If the free layer to pinned layer initial magnetization state can be set to 90° and still have two different magnetoresistance changes, full range of magnetoresistance change will be used and the sensor sensitivity can be increased by a factor of two.

The pinned layer magnetization direction is set by magnetic annealing direction. Usually resistors 104, 106, 108, 110 are made by the same TMR film and experience the same processes, and therefore all have the same pinned layer direction. Each device can operate in full MR ratio, but all the devices respond to the external field in the same way and consequently there is no output voltage at all. A simple way to resolve this issue is to shield resistor 106 and resistor 108 by covering with a thick NiFe film so that resistor 106 and resistor 108 will not respond to magnetic fields. Alternatively, resistors 106 and 108 can be replaced with constant resistors. However, this kind of half bridge-sensing scheme will also reduce the output voltage and therefore limits the sensitivity.

FIGS. 2A and 2B are schematic illustrations of TMR structures 200, 250 according to one embodiment. It is to be understood that the term "TMR resistors" and "TMR structures" are used interchangeably. The TMR resistors 200, 250 each include a seed layer 202, 252 that will be formed on a bottom lead (not shown). In one embodiment, the seed layers 202, 252 comprise a conductive material such as ruthenium and has a thickness of between about 10 Angstroms to about 100 Angstroms and is deposited by well-known deposition methods such as electroplating, electroless plating, or sputtering. Additionally, it is to be understood that while ruthenium has been exemplified as the seed layers 202, 252 material, other materials are contemplated and the embodiments discussed herein are not limited to ruthenium for the seed layers 202, 252. Additionally, the seed layers 202, 252 are deposited simultaneously.

Antiferromagnetic (AFM) layers 204, 254 are disposed on the seed layers 202, 252. Suitable materials for the AFM layers 204, 254 include IrMn, PdMn, NiMn, or PtMn at a thickness of between about 40 Angstroms to about 500 Angstroms. The AFM layers 204, 254 may be formed by well-known deposition methods such as sputtering. Additionally, it is to be understood that while IrMn, PdMn, PtMn, and PtMn have been exemplified as the AFM layers 204, 254 materials, other materials are contemplated and the embodiments discussed herein are not limited to IrMn, PdMn, PtMn, or PtMn for the AFM layers 204, 254. Additionally, the AMF layers 204, 254 are deposited simultaneously.

Pinned layers 206, 256 are disposed on the AFM layers 204, 254. Suitable materials for the pinner layers 206, 256 include CoFe, or a Co/CoFe/Co multi-layer stack with a thickness of between about 20 Angstroms and about 30 Angstroms. The pinned layers 206, 256 may be formed by well-known deposition methods such as sputtering. Additionally, it is to be understood that while CoFe or Co/CoFe/Co have been exemplified as the pinned layers 206, 256 material, other materials are contemplated and the embodiments discussed herein are not limited to CoFe or Co/CoFe/Co for the pinned layers 206, 256. Additionally, the pinned layers 206, 256 are deposited simultaneously.

Spacer layers 208, 258 are disposed on the pinned layers 206, 256. Suitable materials for the spacer layers 208, 258 includes Ru at a thickness of between about 4 Angstroms to about 10 Angstroms. The spacer layers 208, 258 may be formed by well-known deposition methods such as sputtering. Additionally, it is to be understood that while ruthenium has been exemplified as the spacer layers 208, 258 material, other materials are contemplated and the embodiments discussed herein are not limited to ruthenium for the spacer layers 208, 258. Additionally, the spacer layers 208, 258 are deposited simultaneously.

Reference layers 210, 260 are disposed on the spacer layers 208, 258. Suitable materials for the reference layers 210, 260 include CoFe/Ta/CoFeB/CoFe as a multilayer stack. The first CoFe layer may have a thickness of between about 8 Angstroms to about 10 Angstroms. The Ta layer may have a thickness of between about 0.5 Angstroms to about 2 Angstroms. The CoFeB layer may have a thickness of between about 10 Angstroms to about 15 Angstroms. The second CoFe layer may have a thickness of between about 3 Angstroms to about 10 Angstroms. The reference layers 210, 260 may be formed by well-known deposition methods such as sputtering. Additionally, it is to be understood that while CoFe/Ta/CoFeB/CoFe has been exemplified as the reference layers 210, 260 material, other materials are contemplated and the embodiments discussed herein are not limited to CoFe/Ta/CoFeB/CoFe for the reference layers 210, 260. Additionally, the reference layers 210, 260 are deposited simultaneously.

Barrier layers 212, 262 are disposed on the reference layers 210, 260. Suitable material for the barrier layers 212, 262 include MgO at a thickness of between about 10 Angstroms to about 20 Angstroms. It is to be understood that while MgO is exemplified as the barrier layers 212, 262, other insulating materials as contemplated. Additionally, the barrier layers 212, 262 are deposited simultaneously.

First free layers 214, 264 are disposed on the barrier layers 212, 262. Suitable materials for the first free layers 214, 264 include a CoFe/CoFeB/Ta/NiFe multilayer stack. The first CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The first free layers 214, 264 may be formed by well-known deposition methods such as sputtering. Additionally, it is to be understood that while CoFe/CoFeB/Ta/NiFe has been exemplified as the first free layers 214, 264 material, other materials are contemplated and the embodiments discussed herein are not limited to CoFe/CoFeB/Ta/NiFe for the first free layers 214, 264. Additionally, the first free layers 214, 264 are deposited simultaneously.

An additional spacer layer 216 is disposed on the first free layer 214. In one embodiment, the spacer layer 216 is a multilayer structure comprising Co/Ru/Co. It is to be understood that the spacer layer 216 may be a single layer or other multilayer stacks that comprise a first magnetic layer, a non-magnetic conductive layer, and a second magnetic layer. In the embodiment where the spacer layer 216 is Co/Ru/Co, the first Co layer can have a thickness of between about 3 Angstroms to about 6 Angstroms, the Ru layer can have a thickness of between about 6 Angstroms and about 10 Angstroms, and the second Co layer can have a thickness of between about 3 Angstroms to about 6 Angstroms. The Co layers are to enhance the synthetic antiferromagnetic (SAF) coupling. The spacer layer 216 may be formed by well-known deposition methods such as sputtering.

A second free layer 218 is disposed on the spacer layer 216. Suitable materials for the second free layer 218 include NiFe. The NiFe layer may have a thickness of between about 100 Angstroms to about 300 Angstroms, such as between about 100 Angstroms and about 200 Angstroms (the second free layer's 218 moment is larger than the magnetic moment of the first free layer 214) or between about 200 Angstroms and about 300 Angstroms. The second free layer 218 may be formed by well-known deposition methods such as sputtering. Additionally, it is to be understood that while NiFe has been exemplified as the second free layer 218 material, other materials are contemplated and the embodiments discussed herein are not limited to NiFe for the second free layer 218. The first free layer 214 together with the spacer layer 216 and the second free layer 218 collectively form an unbalanced synthetic AFM structure.

For the Wheatstone bridge, all of the resistors cannot be identical. Rather, resistors 104, 110 are identical to each other and resistors 106, 108 are identical to each other and different than resistors 104, 110. TMR sensor 250 will represent the resistors 106, 108 undergoing additional processing.

Another magnetic layer 270 is deposited on the exposed first free layer 264 of TMR 250. The another magnetic layer 270 is substantially identical to the second free layer 218 in composition, but will have a thickness substantially equal to the collective thickness of the spacer layer 216 and second free layer 218. Suitable materials for the second magnetic layer 270 include NiFe. The NiFe layer may have a thickness of between about 100 Angstroms to about 320 Angstroms, such as between about 100 Angstroms and about 200 Angstroms or between about 200 Angstroms and about 320 Angstroms. The magnetic layer 270 may be formed by well-known deposition methods such as sputtering or ion beam deposition. Additionally, it is to be understood that while NiFe has been exemplified as the magnetic layer 270 material, other materials are contemplated and the embodiments discussed herein are not limited to NiFe for the magnetic layer 270.

Capping layers may be formed over the second free layer 218 and the second magnetic layer 270. The TMR structures 200, 250 are annealed in a magnetic oven at a temperature of between about 250 degrees Celsius to about 300 degrees Celsius under a magnetic field of between about 10,000 Oe to about 50,000 Oe. The second magnetic layer 270 has a larger magnetic moment than that the first free layers 214, 264. It is to be understood that the second magnetic layer 270 has a thickness that is greater than the thickness of the first free layer 264. In TMR structure 250, the second magnetic layer 270 is ferromagnetically coupled to the first free layer 264, and the first free layer 264 will provide the magnetoresistance. After annealing, the pinned layers 206, 256 are pinned in the −Z direction, and the reference layers 210, 260 have a magnetic moment in the +Z direction. The hard bias field HBias is shown by arrow 272. When the hard bias field is applied, the first free layer 214 of TMR structure 200 has a magnetic moment shown by arrow 276 that is antiparallel to the magnetic moment shown by arrow 278 of the first free layer 264 of TMR structure 250. Additionally, the second free layer 218 and the second magnetic layer 270 have magnetic moments shown by arrows 274, 280 that are parallel under the applied hard bias. The magnetic moment of the first free layer 214 is antiparallel to the magnetic moment of the second free layer 218 while the magnetic moment of the first free layer 264 is parallel to the magnetic moment of the second magnetic layer 270 under the same hard bias field.

Figure 3B:
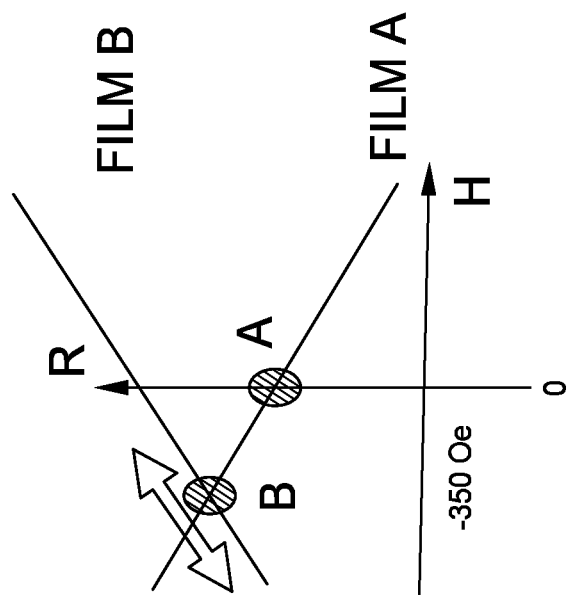
FIGS. 3A and 3B are graphs illustrating the working bias field for two different Wheatstone bridges.
Figure 3A:
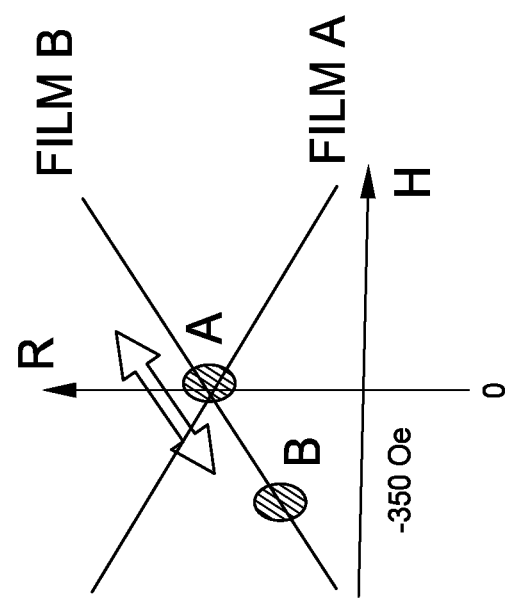

FIGS. 3A and 3B are graphs illustrating the working bias field for two different Wheatstone bridges. Film A may refer to the TMR structure 200 while Film B may refer to TMR structure 250. Point A in FIG. 3A is the location where the lines for Film A and Film B cross. In FIG. 3A, Point A is at the location where the bias field is 0. As discussed above, oftentimes, users desire the location where the lines for Film A and Film B cross to be a non-zero location. Therefore, a shift to the line for either Film A or Film B or both can be used to accommodate the user's desire for a non-zero location. As shown in FIG. 3B, Point B is the location where the lines for Film A and Film B cross, which is at a non-zero location. The non-zero location is shown to be −350 Oe, but it is to be understood that the location need not be −350 Oe, but rather, can be selected by the user. The Wheatstone bridge can then be designed as discussed below to meet the user demands.

Figure 4:
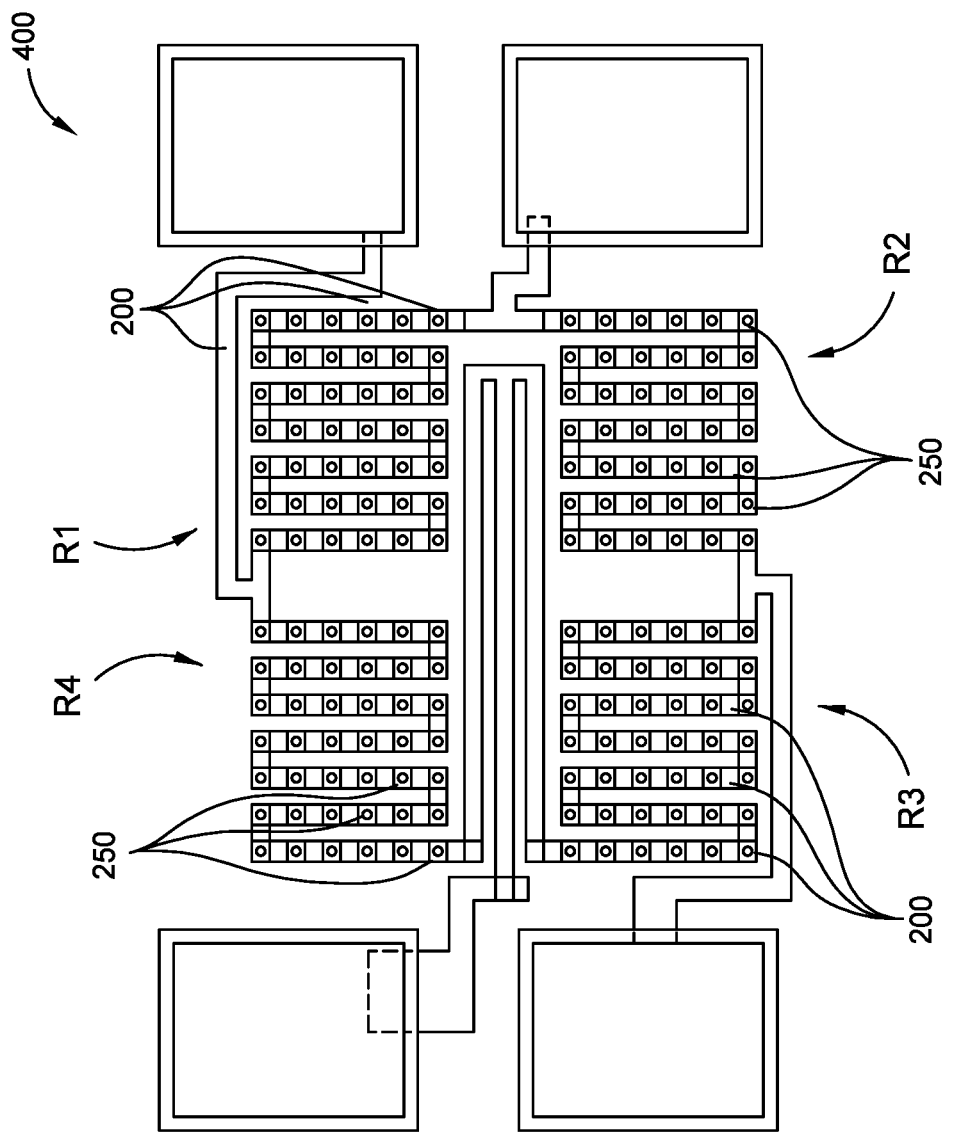
FIG. 4 is a schematic illustration of a Wheatstone bridge with multiple TMR structures for each resistor.

FIG. 4 is a schematic illustration of a Wheatstone bridge 400 with multiple TMR structures for each resistor R1, R2, R3, R4. R1 may correspond to resistor 104; R2 may correspond to resistor 106; R3 may correspond to resistor 110; and R4 may correspond to resistor 108. When the working field bias is set to 0, then R1=R2=R3=R4. Additionally, the resistors R1 and R3 are distinct from resistors R2 and R4 based upon the TMR structures to provide two different magnetoresistances responses.

In the Wheatstone bridge 400, each resistor R1, R2, R3, R4 includes a plurality of TMR structures 200, 250. More specifically, in one embodiment, resistors R1 and R3 will include a plurality of TMR structures 200 and resistors R2 and R4 will include a plurality of TMR structures 250. In another embodiment, resistors R1 and R3 will include a plurality of TMR structures 250 and resistors R2 and R4 will include a plurality of TMR structures 200. For simplicity, FIG. 4 illustrates resistors R1 and R3 having TMR structures 200 while resistors R2 and R4 have TMR structures 250. The TMR structures 200, 250 in resistors R1 and R3 are identical in both number and design. Similarly, the TMR structures 200, 250 in resistors R2 and R4 are identical in both number and design.

The typical magnetic field sensor uses MR devices in a Wheatstone bridge circuit. The key is to make the MR change differently in the bridge. Herein, the magnetic field sensor has an adjustable bias point. Two different sets of TMR structures 200, 250 have with two different magnetoresistance responses. Both TMR structures 200, 250 have free layer and pinned layer magnetic moments that are orthogonal to each other, but the magnetoresistance responses are reversed (i.e., one TMR structure has resistance increasing while the other has resistance decreasing linearly with the external magnetic field). Additionally, the bias point can be adjusted to operate within a given external magnetic field range.

When the user desires a Wheatstone bridge that has a non-zero working field bias, an adjustment to resistor needs to be made. In the embodiments discussed herein, the resistance area is identical for all of the TMR structures 200, 250, and the total number of TMR structures per resistor R1-R4 is identical. More specifically, the TMR structures 200, 250 have the same height, length, and width. To make the non-zero working field bias happen, an additional resistor, R0, is connected in series to R2 and to R4. The additional resistors R0 are non-TMR structures.

Figure 5:
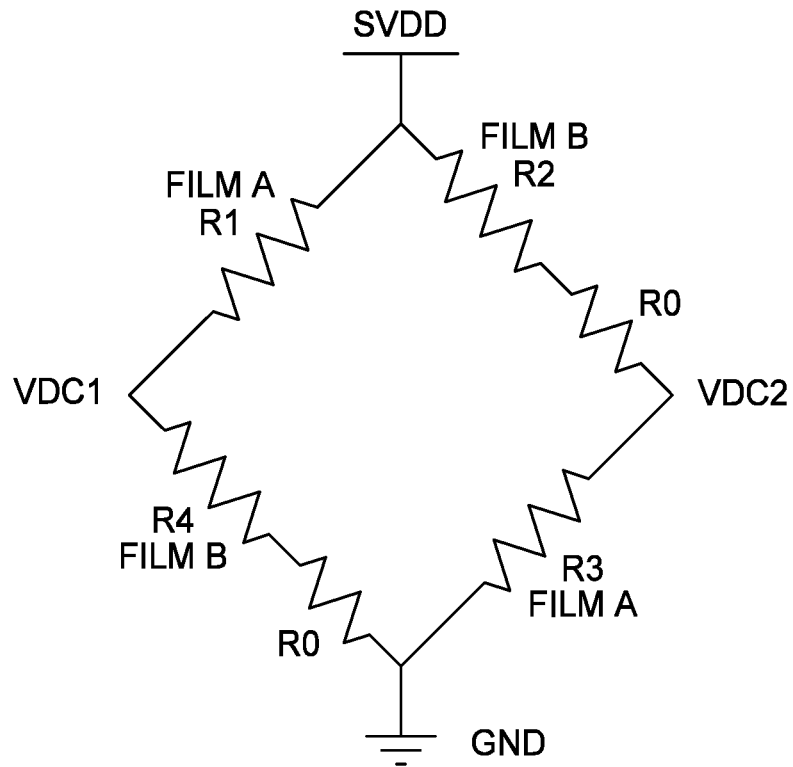
FIG. 5 is a schematic illustration of a Wheatstone bridge according to one embodiment.

FIG. 5 is a schematic illustration of a Wheatstone bridge according to one embodiment. For the embodiment shown in FIG. 5, the resistance area (RA) of TMR structures 200 is equal to the RA of TMR structures 250. The magnetoresistance of the TMR structures 200, 250 are different. For the resistors R1-R4, there are a plurality of TMR structures 200, 250 coupled together in a Wheatstone bridge.

For a position detection application, the bias point (the field that the bridge has a zero output voltage) cannot be at the zero field. A magnet can be used to generate a magnetic field and the Wheatstone bridge sensor detects the field from the magnet. There is a field acting on the sensor at the initial state, and the field is increased or decreased when the magnet moves closer or away from the sensor. The sensor is operating in an asymmetric field range. Thus, the Wheatstone bridge bias point should be at the center of the field range. As shown in FIG. 5, an additional resistor R0, which is a non-TMR resistor, is connected in series to each of R2 and R4. Therefore, the resistance between SVDD (or power source 102) and VDC2 (or second output pad 114), and the resistance between VDC1 (or first output pad 112) and ground 116 is moving up, resulting in a negative bias field such as −350 Oe as shown in FIG. 3B, and the sensor is suitable for sensing in a field range of −500 Oe to −200 Oe.

Figure 6:
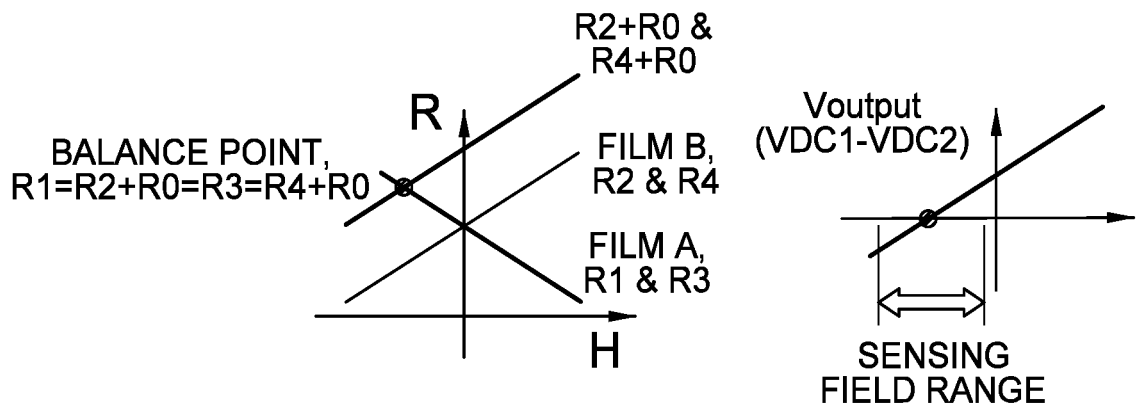
FIG. 6 is schematic illustration of a magnetic field sensor with two different TMR films and a constant R0 connected to R2 and R4.

FIG. 6 is schematic illustration of a magnetic field sensor with two different TMR films and a constant R0 connected in series to R2 and R4. Film A and Film B have the same RA and MR ratio. The Wheatstone bridge bias point (R1=R2+R0=R3=R4+R0) is at a negative field. The sensor is for operating in an asymmetric field range.

Figure 7:
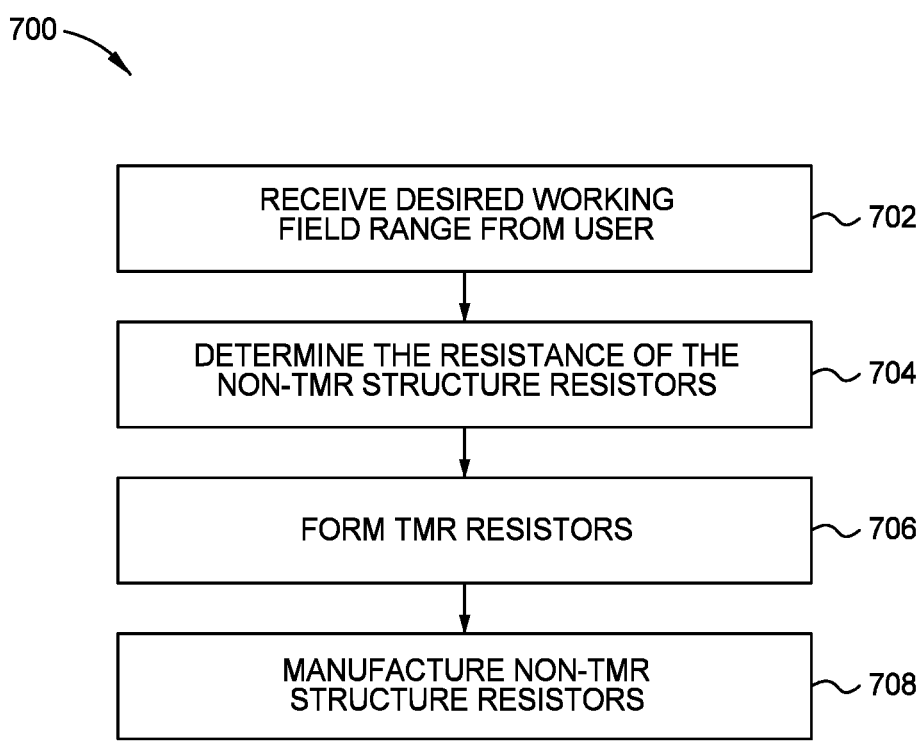
FIG. 7 is a flowchart illustrating a method of manufacturing a Wheatstone bridge.

FIG. 7 is a flowchart illustrating a method 700 of manufacturing a Wheatstone bridge. The method operates by initially receiving the working field range from the user in step 702. Then, the resistance of the non-TMR structure resistor is set for two resistors in step 704. As the non-TMR resistor will simply be a metal that has a certain length and width, the non-TMR resistor may be fabricated at any step in the fabrication of the TMR structures 200, 250. Suitable material that may be used for the non-TMR resistors include Cr, NiCr, Ru, Cu, Ta, Ti, Au, or any conductive material. Furthermore, the non-TMR resistors may be fabricated by depositing the conductive material by well known deposition processes such as electroless plating, electroplating, or sputtering. Suitable thickness for the non-TMR resistors include between about 100 Angstroms to about 1000 Angstroms. The thickness of the non-TMR resistor and the material of the non-TMR resistor will determine the bias point. Thereafter, the TMR structure resistors are formed in step 706. Finally, the non-TMR structure resistors are manufactured simultaneously in step 708.

In one embodiment, a TMR sensor device comprises: a first resistor comprising a first plurality of TMR structures; a second resistor comprising a second plurality of TMR structures; a third resistor comprising a third plurality of TMR structures; a fourth resistor comprising a fourth plurality of TMR structures; and a fifth resistor connected in series to the second resistor, wherein the fifth resistor is a non-TMR resistor. The array further comprises a sixth resistor connected in series to the fourth resistor, wherein the sixth resistor is a non-TMR resistor. The fifth resistor and the sixth resistor are identical. The first plurality of TMR structures is equal to the third plurality of TMR structures. The second plurality of TMR structures is equal to the fourth plurality of TMR structures. The first plurality of TMR structures is equal to the second plurality of TMR structures. The first resistor and the third resistor have the same RA. The second resistor and the fourth resistor have the same RA. The first resistor and the second resistor have the same RA. The TMR structures of the first plurality of TMR structures are identical to each other. The TMR structures of the second plurality of TMR structures are identical to each other. The TMR structures of the first plurality of TMR structures are different from the TMR structures of the second plurality of TMR structures.

In another embodiment, a TMR sensor device comprises: a plurality of resistors that each contain a plurality of TMR structures, wherein at least two resistors of the plurality of resistors contain different TMR structures, wherein at least two resistors of the plurality of resistors contain identical TMR structures, and wherein at least two resistors are non-TMR structure resistors. The TMR structures have substantially identical RA. The Wheatstone bridge has a bias point that is non-zero Oe. At least one TMR structure contains a synthetic antiferromagnetic structure. There are at least two non-TMR resistors present.

In another embodiment, a method of manufacturing a TMR sensor device comprises: forming a first resistor having a first plurality of TMR structures; forming a second resistor having a second plurality of TMR structures; forming a third resistor having a third plurality of TMR structures; forming a fourth resistor having a fourth plurality of TMR structures; and forming a fifth resistor that has no TMR structures, wherein the fifth resistor is connected in series to the second resistor. The method further comprises forming a sixth resistor that has no TMR structures. The sixth resistor is connected in series to the fourth resistor.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

By adding an additional, non-TMR resistor to a Wheatstone bridge while keeping the RA constant for all TMR structures as well as the number of TMR structures per TMR containing resistor, the working bias field point can be tailored to meet the needs of the user.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) sensor device, comprising:
   a first resistor comprising a first plurality of TMR structures;
   a second resistor comprising a second plurality of TMR structures;
   a third resistor comprising a third plurality of TMR structures;
   a fourth resistor comprising a fourth plurality of TMR structures; and
   a fifth resistor connected in series to the second resistor, wherein the fifth resistor is a non-TMR resistor.

2. The TMR sensor device of claim 1, further comprising a sixth resistor coupled to the fourth resistor, wherein the sixth resistor is a non-TMR resistor.

3. The TMR sensor device of claim 2, wherein the fifth resistor and the sixth resistor are identical.

4. The TMR sensor device of claim 1, wherein the first plurality of TMR structures is equal to the third plurality of TMR structures.

5. The TMR sensor device of claim 4, wherein the second plurality of TMR structures is equal to the fourth plurality of TMR structures.

6. The TMR sensor device of claim 5, wherein the first plurality of TMR structures is equal to the second plurality of TMR structures.

7. The TMR sensor device of claim 1, wherein the first resistor and the third resistor have the same resistance area (RA).

8. The TMR sensor device of claim 7, wherein the second resistor and the fourth resistor have the same RA.

9. The TMR sensor device of claim 8, wherein the first resistor and the second resistor have the same RA.

10. The TMR sensor device of claim 1, wherein the TMR structures of the first plurality of TMR structures are identical to each other.

11. The TMR sensor device of claim 1, wherein the TMR structures of the second plurality of TMR structures are identical to each other.

12. The TMR sensor device of claim 1, wherein the TMR structures of the first plurality of TMR structures are different from the TMR structures of the second plurality of TMR structures.

13. A TMR sensor device, comprising:
    a plurality of resistors that each contain a plurality of TMR structures, wherein at least two resistors of the plurality of resistors contain structurally different TMR structures, wherein at least two resistors of the plurality of resistors contain identical TMR structures, and wherein at least two resistors are non-TMR structure resistors.

14. The TMR sensor device of claim 13, wherein the TMR structures have substantially identical resistance area (RA).

15. The TMR sensor device of claim 13, wherein the TMR sensor device has a bias point that is non-zero Oe.

16. The TMR sensor device of claim 13, wherein at least one TMR structure contains a synthetic antiferromagnetic structure.

17. The TMR sensor device of claim 16, wherein there are at least two non-TMR resistors present.

18. A method of manufacturing a TMR sensor device, comprising:
    forming a first resistor having a first plurality of TMR structures;
    forming a second resistor having a second plurality of TMR structures;
    forming a third resistor having a third plurality of TMR structures;
    forming a fourth resistor having a fourth plurality of TMR structures; and
    forming a fifth resistor that has no TMR structures, wherein the fifth resistor is connected in series to the second resistor.

19. The method of claim 18, further comprising forming a sixth resistor that has no TMR structures.

20. The method of claim 19, wherein the sixth resistor is connected in series to the fourth resistor.

* * * * *